US010290698B2

(12) United States Patent  
Singh

(10) Patent No.: US 10,290,698 B2  
(45) Date of Patent: May 14, 2019

(54) SUBSTRATE RESISTOR WITH OVERLYING GATE STRUCTURE

(71) Applicant: GLOBALFOUNDRIES Inc., Grand Cayman (KY)

(72) Inventor: Jagar Singh, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 242 days.

(21) Appl. No.: 15/437,057

(22) Filed: Feb. 20, 2017

(65) Prior Publication Data

US 2017/0162647 A1   Jun. 8, 2017

Related U.S. Application Data

(62) Division of application No. 14/584,068, filed on Dec. 29, 2014, now Pat. No. 9,614,023.

(51) Int. Cl.
*H01L 29/76* (2006.01)
*H01L 49/02* (2006.01)
(Continued)

(52) U.S. Cl.
CPC ...... *H01L 28/20* (2013.01); *H01L 21/823431* (2013.01); *H01L 27/0629* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS

2002/0036290 A1   3/2002   Inaba et al.
2006/0073647 A1   4/2006   Inaba
(Continued)

FOREIGN PATENT DOCUMENTS

CN   103283016 A   9/2013
TW   200943531 A   10/2009
TW   201424003 A   6/2014

OTHER PUBLICATIONS

Taiwanese Rejection Decision dated Mar. 10, 2017, for TW application No. 104131393, filed on Sep. 23, 2015.
(Continued)

*Primary Examiner* — Yu Chen
(74) *Attorney, Agent, or Firm* — Amerson Law Firm, PLLC

(57) ABSTRACT

An illustrative method includes, among other things, forming a plurality of fins. A subset of the plurality of fins is selectively removed, leaving at least a first fin to define a first fin portion and at least a second fin to define a second fin portion. A first type of dopant is implanted into a substrate to define a resistor body and the first type of dopant is implanted into the first and second fins. The first fin portion is disposed above a first end of the resistor body and the second fin is disposed above a second end of the resistor body. An insulating layer is formed above the resistor body. At least one gate structure is formed above the insulating layer and above the resistor body.

17 Claims, 7 Drawing Sheets

(51) Int. Cl.
*H01L 27/06* (2006.01)
*H01L 29/78* (2006.01)
*H01L 29/66* (2006.01)
*H01L 21/8234* (2006.01)

(52) U.S. Cl.
CPC ........ *H01L 29/66227* (2013.01); *H01L 29/76* (2013.01); *H01L 29/785* (2013.01)

(58) Field of Classification Search
CPC ......... H01L 27/10826; H01L 27/10879; H01L 27/1211; H01L 29/1037; H01L 29/41791; H01L 29/66795–29/66818; H01L 29/785–29/7856; H01L 27/0629; H01L 28/20; H01L 29/66166; H01L 29/66227; H01L 29/76; H01L 29/7838; H01L 29/86; H01L 29/8605; H01L 2029/7857–2029/7858; H01C 7/10–7/1013
See application file for complete search history.

(56) References Cited

U.S. PATENT DOCUMENTS

| | | |
|---|---|---|
| 2007/0040221 A1 | 2/2007 | Gossner |
| 2012/0175749 A1 | 7/2012 | Haensch et al. |
| 2013/0099317 A1 | 4/2013 | Xia et al. |
| 2013/0307076 A1* | 11/2013 | Cheng ................... H01L 21/845 257/350 |
| 2014/0134822 A1* | 5/2014 | Srinivasan ........ H01L 29/66795 438/382 |
| 2014/0167172 A1 | 6/2014 | Chen et al. |
| 2014/0231960 A1 | 8/2014 | Kim et al. |
| 2014/0328128 A1 | 11/2014 | Louie et al. |
| 2014/0339641 A1 | 11/2014 | Hong et al. |
| 2015/0325572 A1* | 11/2015 | Cheng ................... H01L 21/762 257/369 |

OTHER PUBLICATIONS

Chinese First Office Action dated Nov. 30, 2017, for Chinese patent application No. 201510998958.9, filed on Dec. 28, 2015.
Taiwanese Examination Report dated Aug. 3, 2016 for Taiwan patent application No. 104131393.
Taiwanese Office Action dated Jul. 21, 2016, for Taiwan patent application No. 104131392 filed on Sep. 23, 2015.
Office Action from related U.S. Appl. No. 14/583,943 dated Apr. 6, 2016.
Final Office Action from related U.S. Appl. No. 14/583,943 dated Oct. 6, 2016.

* cited by examiner

SUBSTRATE RESISTOR WITH OVERLYING GATE STRUCTURE

BACKGROUND OF THE INVENTION

1. Field of the Invention

The present disclosure generally relates to the fabrication of semiconductor devices, and, more particularly, to a substrate resistor with an overlying gate structure.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout. Field effect transistors (NMOS and PMOS transistors) represent one important type of circuit element that substantially determines performance of such integrated circuits. During the fabrication of complex integrated circuits using, for instance, MOS technology, millions of transistors, e.g., NMOS transistors and/or PMOS transistors, are formed on a substrate including a crystalline semiconductor layer. A field effect transistor, whether an NMOS or a PMOS device, is a planar device that typically includes a source region, a drain region, a channel region that is positioned between the source region and the drain region, and a gate structure positioned above the channel region. The gate structure is typically comprised of a very thin gate insulation layer and one or more conductive layers that act as a conductive gate electrode. In a field effect transistor, the conductivity of the channel region, i.e., the drive current capability of the conductive channel, is controlled by applying an appropriate voltage to the gate electrode.

In modern integrated circuits, a very high number of individual circuit elements, such as field effect transistors in the form of CMOS, NMOS, PMOS elements and the like, are formed on a single chip area. In addition to the large number of transistor elements, a plurality of passive circuit elements, such as capacitors, resistors and the like, are typically formed in integrated circuits that are used for a plurality of purposes, such as for decoupling.

To improve process integration, it is useful to use similar structures for forming different types of devices. For example, if structures that are used in the formation of transistors can also be used to fabricate resistors, the processing efficiencies may be increased. Polysilicon lines may be used in the fabrication of transistors as gate electrodes. A resistor may also be created using a polysilicon line. The resistance of a polysilicon resistor is determined essentially by its length and cross-sectional area. It is difficult to provide resistors with varying resistance in an array of parallel resistors. In addition, the amount of current that can be carried by a polysilicon resistor is limited due to Ohmic heating. If the current passing through the resistor is sufficiently high, a rupture may occur, resulting in a change to the resistance value or an open circuit (similar to a fuse).

The present disclosure is directed to various methods and resulting devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming semiconductor resistor devices and the resulting devices. An illustrative method includes, among other things, forming a plurality of fins. A subset of the plurality of fins is selectively removed, leaving at least a first fin to define a first fin portion and at least a second fin to define a second fin portion. A first type of dopant is implanted into a substrate to define a resistor body and the first type of dopant is implanted into the first and second fins. The first fin portion is disposed above a first end of the resistor body and the second fin is disposed above a second end of the resistor body. An insulating layer is formed above the resistor body. At least one gate structure is formed above the insulating layer and above the resistor body.

Another illustrative method includes, among other things, forming a plurality of fins. One or more of the plurality of fins are selectively removed, leaving a first subset of fins and a second subset of fins. A first type of dopant is implanted into a substrate between the first and second subsets of the fins to define a resistor body and the dopant is implanted into the first and second subsets of the fins. The first subset is disposed above a first end of the resistor body and the second subset is disposed above a second end of the resistor body. An insulating layer is formed above the resistor body. At least one gate structure disposed parallel to the first and second subsets of the fins is formed above the insulating layer and above the resistor body.

One illustrative resistor device includes, among other things, a resistor body disposed in a substrate and doped with a first type of dopant, a first fin contacting a first end of the resistor body and doped with the first type of dopant, a second fin contacting a second end of the resistor body and doped with the first type of dopant, an insulating layer disposed above the resistor body, and at least one gate structure disposed above the insulating layer and above the resistor body, wherein the at least one gate structure is disposed parallel to the first and second fins.

BRIEF DESCRIPTION OF THE DRAWINGS

The disclosure may be understood by reference to the following description taken in conjunction with the accompanying drawings, in which like reference numerals identify like elements, and in which.

Figure 1A:
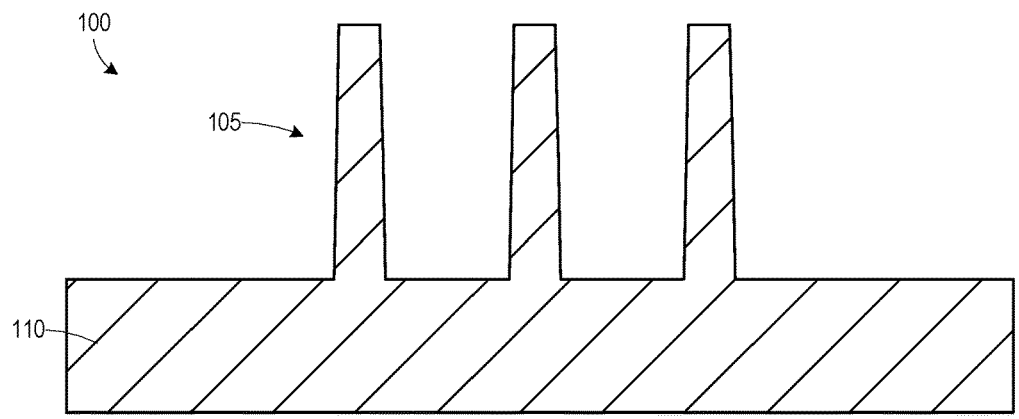
FIGS. 1A-1E depict a method of forming a fin resistor with at least one overlying gate structure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming resistor structures with gate structures overlying the resistor body to modulate the resistance of the resistor and to provide a localized heat sink for the resistor body. As will be readily apparent to those skilled in the art upon a complete reading of the present application, the present method is applicable to a variety of devices, including, but not limited to, logic devices, memory devices, etc. With reference to the attached figures, various illustrative embodiments of the methods and devices disclosed herein will now be described in more detail.

FIGS. 1A-1E illustrate various novel methods disclosed herein for forming a resistor device 100. FIG. 1A shows a cross-sectional view of a plurality of fins 105 defined in a substrate 110. The number of fins 105 and the spacing between fins 105 may vary depending on the particular characteristics of the device(s) being formed. The substrate 110 may have a variety of configurations, such as the depicted bulk silicon configuration. The substrate 110 may also have a silicon-on-insulator (SOI) configuration that includes a bulk silicon layer, a buried insulation layer and an active layer, wherein semiconductor devices are formed in and above the active layer. The substrate 110 may be formed of silicon or silicon germanium or it may be made of materials other than silicon, such as germanium. Thus, the terms "substrate" or "semiconductor substrate" should be understood to cover all semiconducting materials and all forms of such materials. The substrate 110 may have different layers. For example, the fins 105 may be formed in a process layer formed above the base layer of the substrate 110.

In general, the process flow for forming the resistor device 100 may be integrated with a process flow for forming finFET transistor devices (not shown). Similar fins (not shown) may be employed, wherein source/drain and channel regions for the finFET devices may be formed.

Figure 1B:
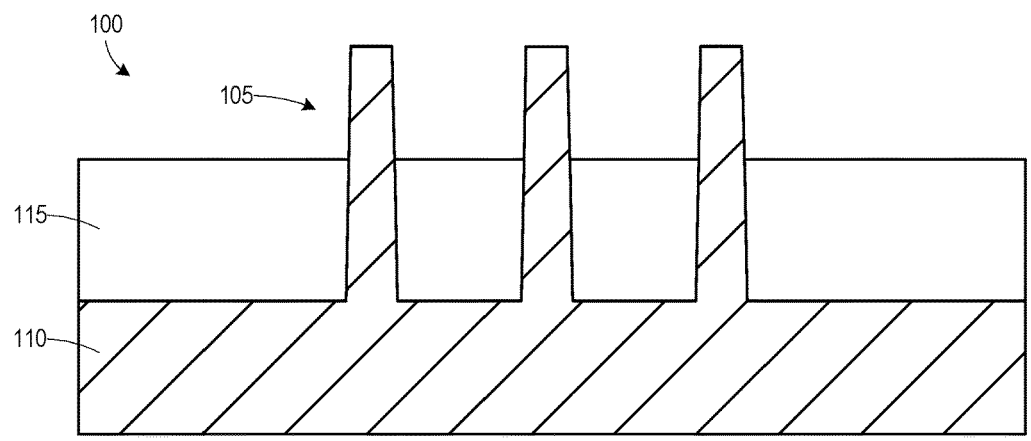

FIG. 1B illustrates the resistor device 100 after various processes have been performed to define an isolation structure 115 between the fins 105. For example, a layer of insulating material (e.g., silicon dioxide) may be formed above the substrate 110 to cover the fins 105. The insulating material may be recessed to expose a desired height of the fins 105, leaving portions of the insulating material between the fins 105 to define the isolation structures 115.

Figure 1C:
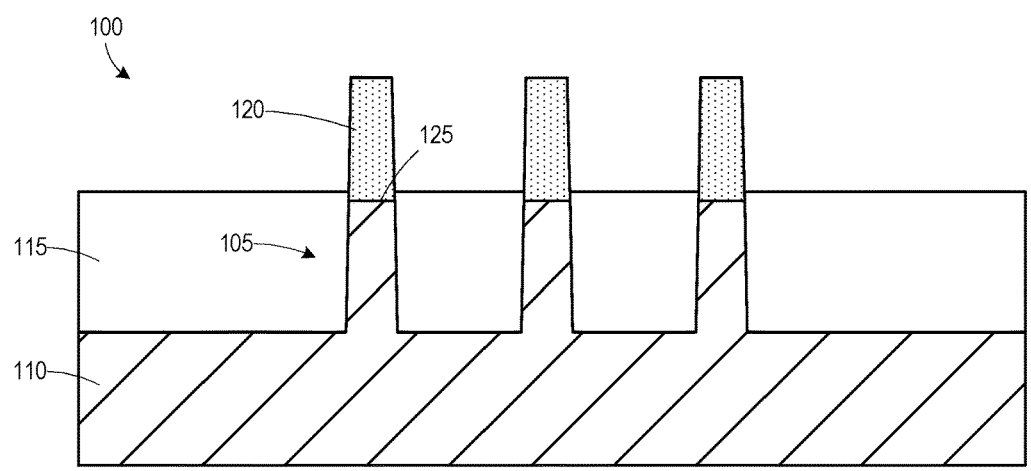

FIG. 1C illustrates the resistor device 100 after an implantation process has been performed to counter-dope top fin portions 120 of the fins 105. For example, the substrate 110 may have been doped with a P-type dopant. The implantation process introduces N-type dopants into the top fin portions 120, thereby creating a PN junction 125 in the fin 105. The PN junction 125 serves to electrically isolate the top fin portions 120 from the substrate 110. Of course, the reverse could be true as well—the substrate 110 may be doped with an N-type dopant and the top fin portions 120 would then be doped with a P-type dopant.

Figure 1D:
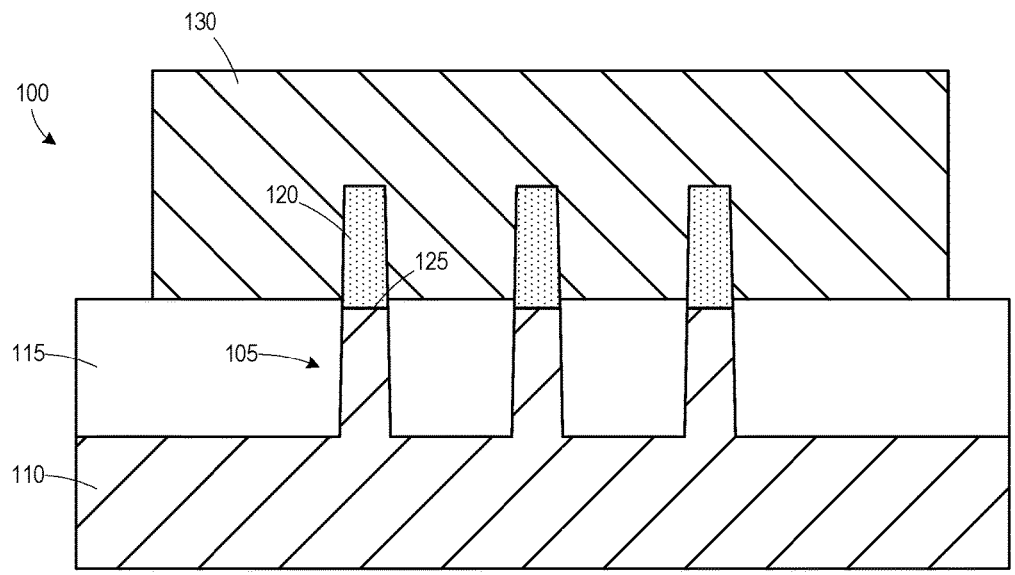

FIG. 1D illustrates the resistor device 100 after various processes have been performed to form one or more gate structures 130 above the fins 105. In one illustrative embodiment, well-known replacement gate techniques (from the process flow for the formation of gate structures on planar and finFET devices) may be used to form the gate structures 130. In a replacement gate technique, a placeholder gate structure (e.g., polysilicon gate electrode with an underlying silicon dioxide gate insulation layer) is first formed and subsequently replaced with a metal gate structure (e.g., metal gate electrode with an underlying high-k gate insulation layer). However, the application of the present subject matter is not limited to a replacement gate or "gate-last" technique, but rather, a gate-first technique may also be used, where a functional gate electrode including a gate insulation layer and a conductive gate electrode (doped polysilicon, silicide, metal, etc.) is initially formed. Hence, the gate structure 130 may be a placeholder or dummy gate structure or a functional gate structure.

Figure 1E:
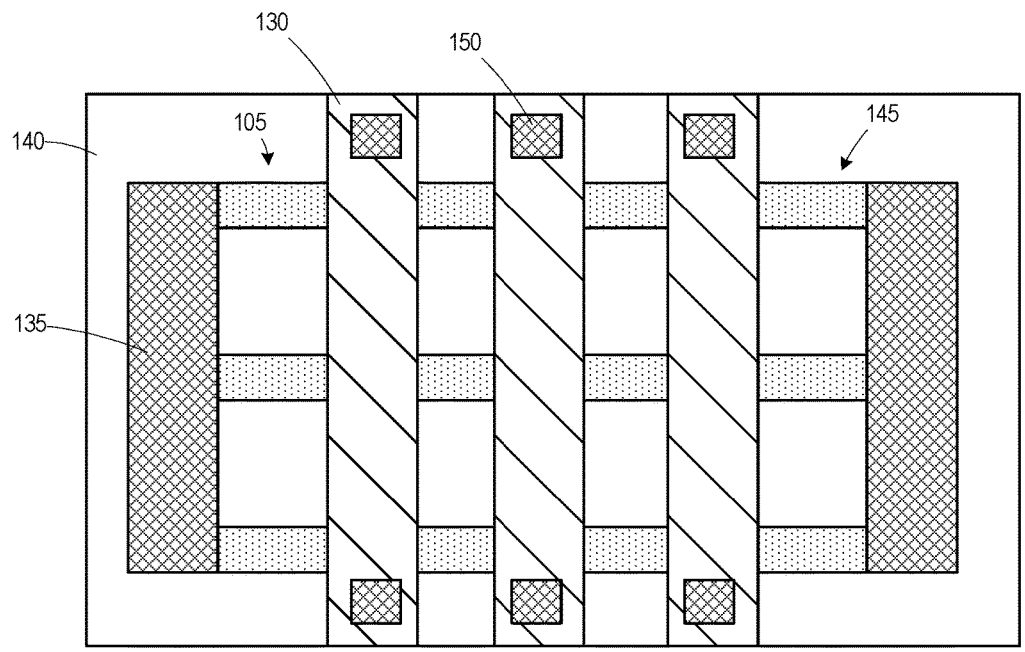

FIG. 1E illustrates a top view of the resistor device 100 of FIG. 1D after several processes have been performed to define contacts 135 on ends of the fins 105 to define terminals for the resistor device 100. An additional layer of insulating material 140 (e.g., silicon dioxide or a so-called low-k dielectric material) is formed above the fins 105 and gate structures 130 and patterned to define recesses into which conductive material is deposited and planarized to define the contacts 135. The fins 105 define a resistor body 145.

Additional processing steps (not shown) may be performed during the fabrication of the resistor device 100, such as silicidation processes on the top fin portions 120 and/or the contacts 135. Subsequent metallization layers and interconnect lines and vias may also be formed.

Various structural characteristics of the resistor device 100 affect its resistance, such as the number of fins 105, the number of gate structures 130, the spacing between gate structures 130, etc. In one embodiment, the gate structures 130 may not be evenly spaced, resulting in an asymmetric arrangement. The resistance of the resistor device 100 may be dynamically altered (i.e., during operation of an integrated circuit device including the resistor device 100) by applying a bias voltage to one or more of the gate structures 130. In general, applying a positive voltage to the gate structures 130 reduces the resistance of the resistor device 100. To enable the application of a bias voltage, one or more gate contacts 150 may also be defined. In addition to affecting the resistance of the resistor device 100, the gate structures 130 also act as heat sinks to reduce the effects of localized heating during operation of the resistor device 100.

In some embodiments, the resistance of the resistor device 100 may be programmable. For example, a programming voltage may be applied to one or more of the gate structures 130 causing them to partially or completely rupture. Subsequently, when a bias voltage is applied, its effect on the resistance of the resistor device 100 is different depending on whether one or more of the gate structures 130 has been "programmed" or ruptured. By using different bias voltages (e.g., bias "on" or bias "off") and/or selective programming, two different resistor devices 100 with the same basic structure can be made to have different resistance values. In some embodiments, the resistor device 100 may be operated as a fuse by applying a programming voltage to the resistor body sufficiently high to cause one or more of the fins 105 to rupture, thereby changing its resistance value or creating an open circuit.

Figure 2A:
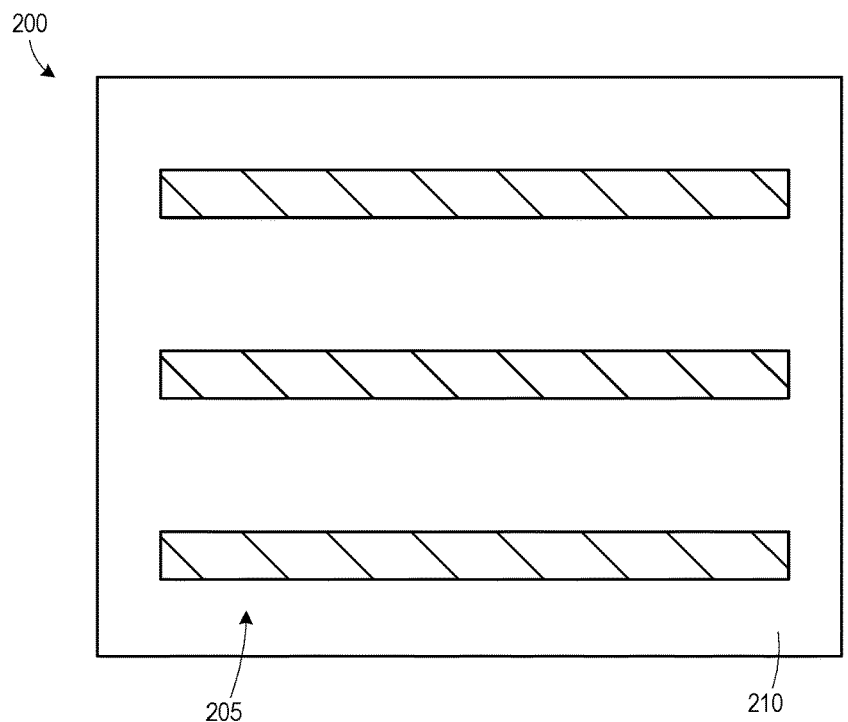
FIGS. 2A-2G depict a method of forming a resistor device with at least one overlying gate structure.

FIGS. 2A-2G illustrate various novel methods disclosed herein for forming an alternative embodiment of a resistor device 200. FIG. 2A shows a top view of a plurality of fins 205 defined in a substrate 210. As described above, the substrate 210 may have a variety of configurations and materials. The fins 205 and the substrate 210 are illustrated with different cross-hatching to allow them to be distinguished from one another in FIG. 2A. They may be made of the same material.

Figure 2B:
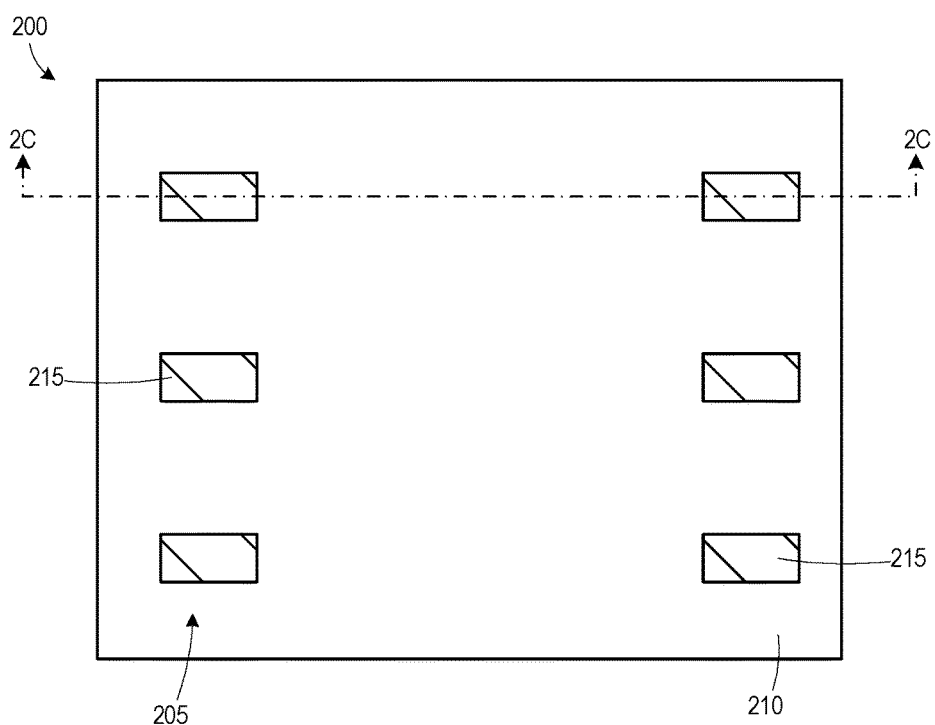

FIG. 2B illustrates the resistor device 200 after several processes have been performed to remove middle portions of the fins 205, leaving end portions 215. A patterned photoresist mask may be provided to cover the end portions 215 and expose the middle portions and a subsequent anisotropic etching process may be performed to remove the middle portions. An isotropic etch may remove the middle portions of the fins 205 much faster than removing material on the exposed planar surfaces of the substrate 210 due to the exposure of the middle portions of the fins 205 to the etch environment on three sides. Some recessing of the planar surface of the substrate 210 may occur.

Figure 2C:
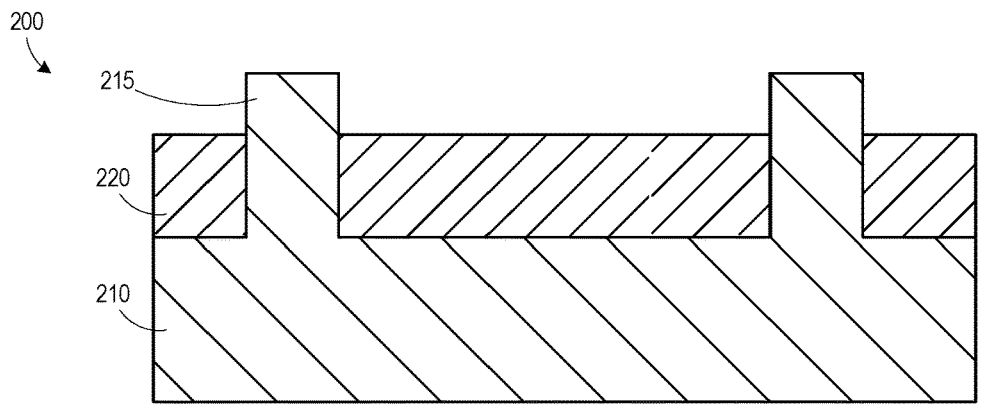

FIG. 2C shows a cross-section view of the resistor device 200 along the line 2C shown in FIG. 2B after several processes are performed to form an insulating layer 220 (e.g., silicon dioxide) above the substrate 210. The layer of insulating material 220 may be deposited and planarized to the height of the fin end portions 215, and an etch process may be used to recess the insulating layer 220 to a height less than that of the fin end portions 215. In some embodiments, the recess etch may be omitted, and the height of the insulating layer 220 may be approximately the same as that of the fin end portions 215.

Figure 2D:
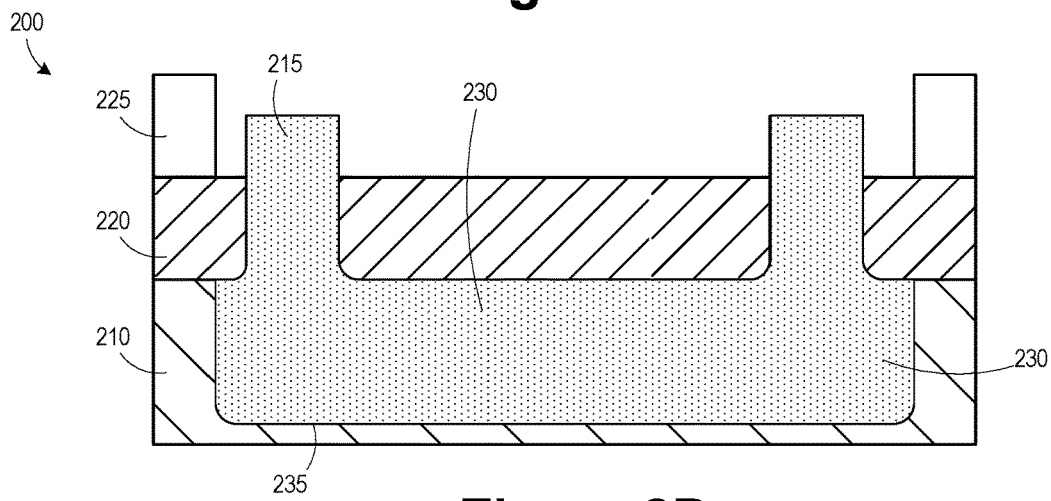

FIG. 2D illustrates the device 200 after an implant process has been performed in the presence of a patterned resist mask 225 to dope the fin end portions 215 and define a doped resistor body 230 in the substrate 210. For example, the substrate 210 may have been doped with a P-type dopant. The implantation process introduces N-type dopants into the fin end portions 215 and into the substrate 210, thereby creating a PN junction 235 in the substrate 210. The PN junction 235 serves to electrically isolate the resistor body 230 from the substrate 210.

Figure 2E:
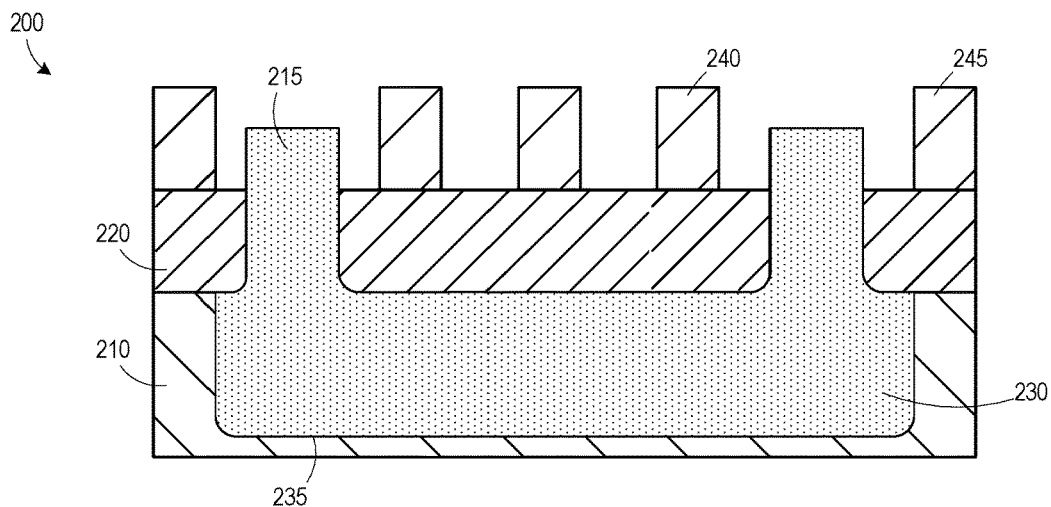

FIG. 2E illustrates the device 200 after the resist mask 225 is removed and a plurality of processes have been performed to define one or more gate structures 240 on the insulating layer 220 and above the resistor body 230. As described above, a replacement gate technique may be used, so the gate structure 240 may be a placeholder gate structure or a metal gate structure. One or more additional gate structures 245 may be formed in a region not disposed above the resistor body 230 to provide a consistent pitch of line features.

Additional processing steps (not shown) may be performed during the fabrication of the resistor device 200, such as silicidation processes on the fin end portions 215, the formation of contacts interfacing with the fin end portions 215 and the gate structures 240. Subsequent metallization layers and interconnect lines and vias may also be formed.

Figure 2F:
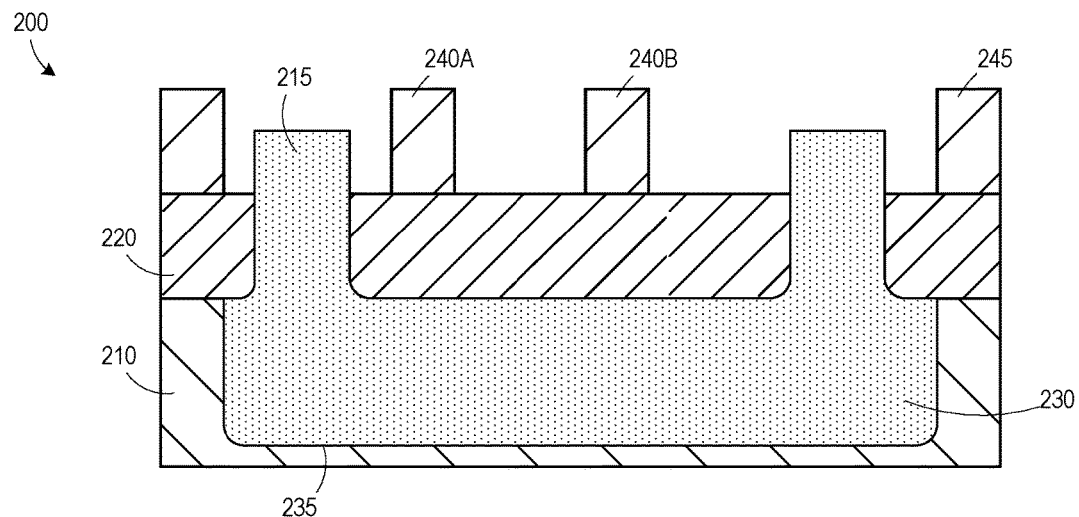

Various structural characteristics of the resistor device 200 affect its resistance, such as the number of gate structures 240, the spacing between gate structures 240, etc. As shown in FIG. 2F, the gate structures 240A, 240B may not be evenly spaced with respect to the fin portions 215, resulting in an asymmetric arrangement.

Figure 2G:
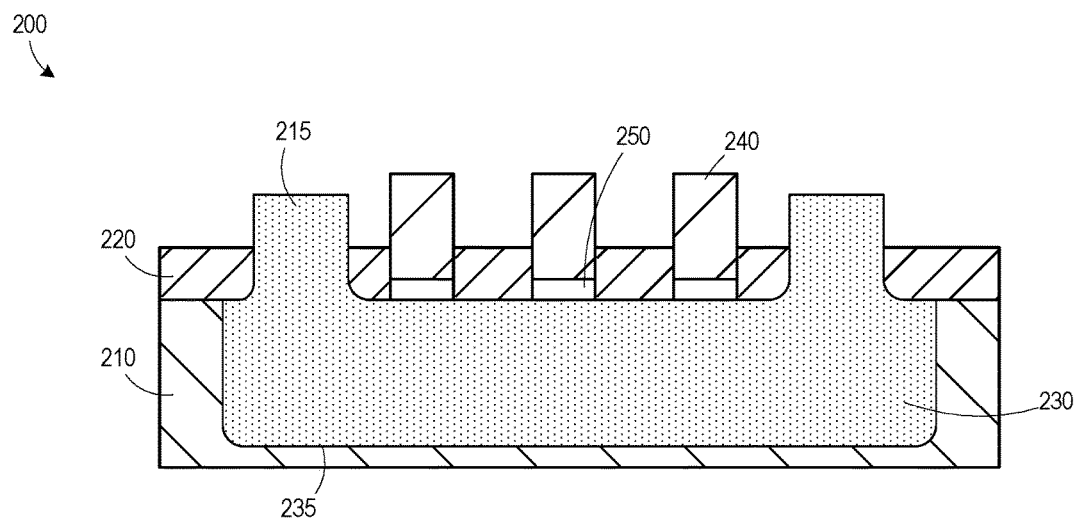

FIG. 2G illustrates an alternative embodiment of the resistor device 200 where openings are formed in the insulating layer 220 by performing an etching process through a patterned etch mask (not shown). Thereafter, a gate dielectric layer 250 is formed prior to forming the gate structures 240. In another embodiment, the gate dielectric layer 250 may be formed by partially recessing the insulating layer 220, leaving a portion disposed between the resistor body 230 and the gate structures 240. Using a thinner gate dielectric layer 250 beneath the gate structures 240 increases the effects of the gate structures 240 on the resistance of the resistor device 200.

The resistance of the resistor device 200 may be dynamically altered (i.e., during operation of an integrated circuit device including the resistor device 200) by applying a bias voltage to the gate structures 240 or by selectively programming one or more of the gate structures 240, as described above. In addition to affecting the resistance of the resistor device 200, the gate structures 240 also act as heat sinks to reduce the effects of localized heating during operation of the resistor device 200.

Figure 3A:
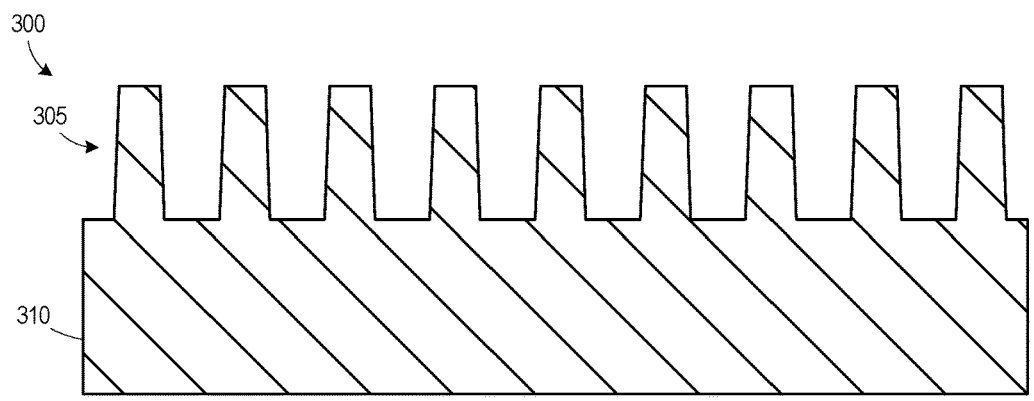
FIGS. 3A-3F depict a method of forming another embodiment of a resistor device with at least one overlying gate structure.

FIGS. 3A-3F illustrate various novel methods disclosed herein for forming an alternative embodiment of a resistor device 300. FIG. 3A shows a cross-section view of a plurality of fins 305 defined in a substrate 310. As described above, the substrate 310 may have a variety of configurations and materials.

Figure 3B:
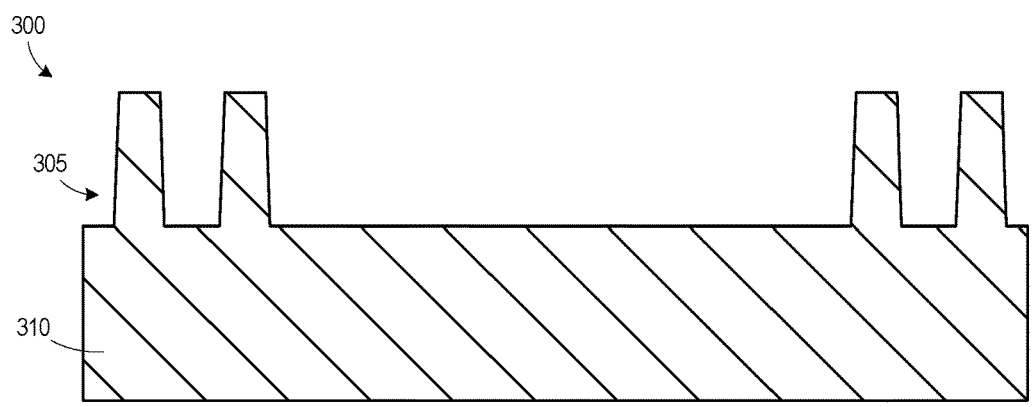

FIG. 3B illustrates the resistor device 300 after several processes have been performed to remove selected fins 305. A patterned photoresist mask may be provided to cover a first portion of the fins 305 and expose a second portion of the fins 305 and a subsequent anisotropic etching process may be performed to remove the exposed fins 305. As described above, an isotropic etch process may be used.

Figure 3C:
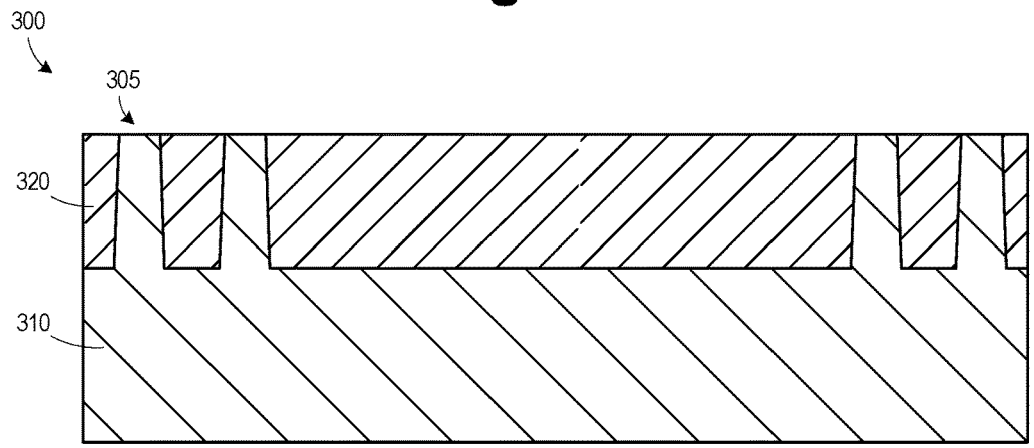

FIG. 3C illustrates the resistor device 300 after several processes are performed to form an insulating layer 320 (e.g., silicon dioxide) above the substrate 310. A layer of insulating material may be deposited and planarized to the height of the fins 305. In some embodiments, a recess etch may be provided.

Figure 3D:
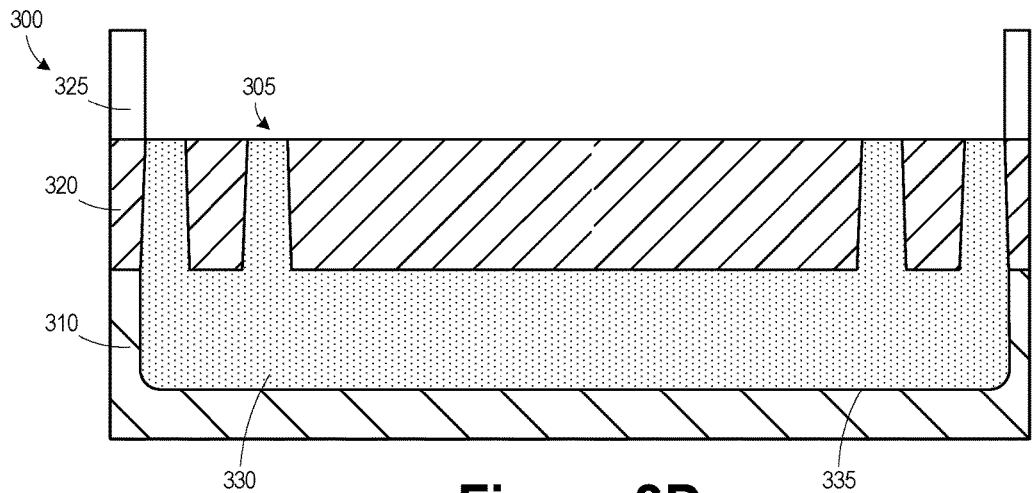

FIG. 3D illustrates the device 300 after an implant process has been performed in the presence of a patterned resist mask 325 to dope the fins 305 and define a resistor body 330 in the substrate 310. For example, the substrate 310 may have been doped with a P-type dopant. The implantation process introduces N-type dopants into the fins 305 and into the substrate 310, thereby creating a PN junction 335 in the substrate 310. The PN junction 335 serves to electrically isolate the resistor body 330 from the substrate 310.

Figure 3E:
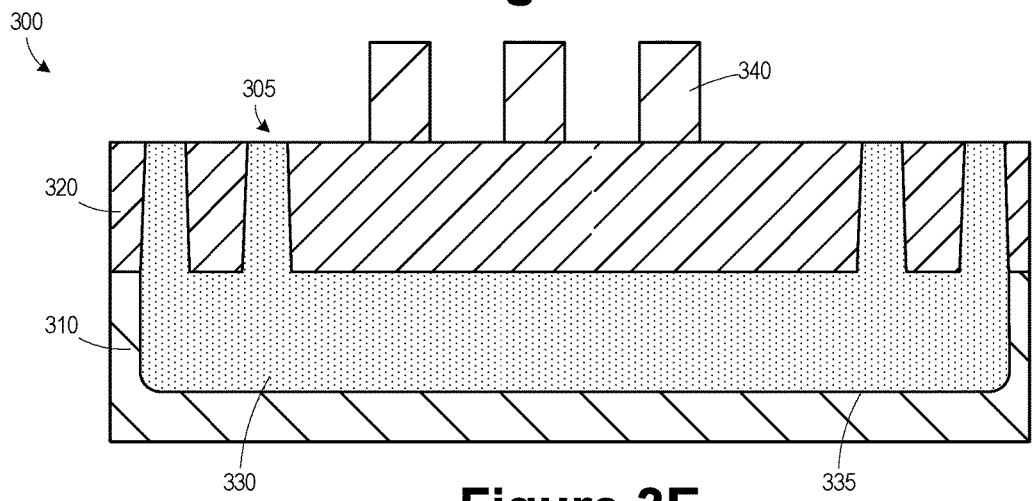

FIG. 3E illustrates the device 200 after the resist mask 325 is removed and a plurality of processes have been performed to define one or more gate structures 340 on the insulating layer 320 and above the resistor body 330. As described above, a replacement gate technique may be used, so the gate structure 340 may be a placeholder gate structure or a metal gate structure. One or more additional gate structures (not shown) may be formed in a region not disposed above the resistor body 330 to provide a consistent pitch of line features.

Figure 3F:
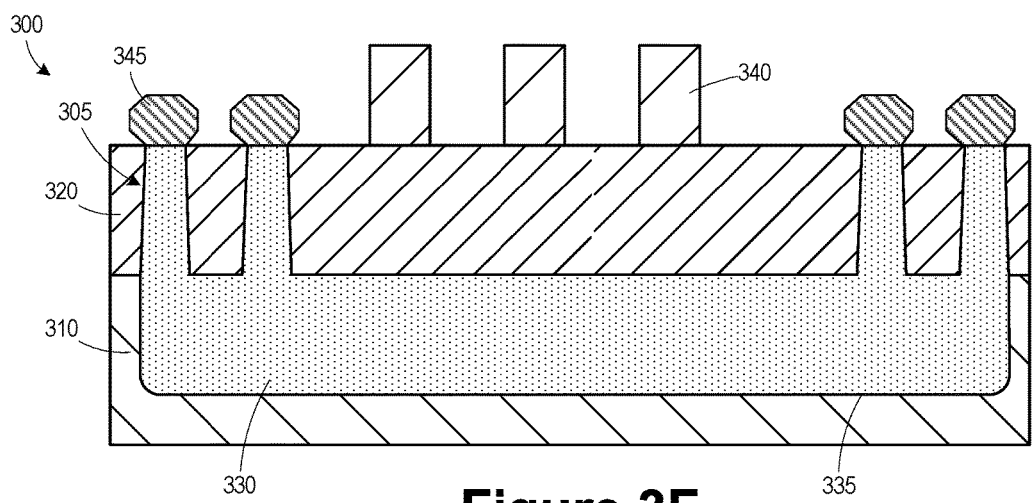

FIG. 3F illustrates the device 300 after an epitaxial growth process has been performed to form epitaxial regions 345 (e.g., N-doped) on end portions of the fins 305. In some embodiments, the epitaxial regions 345 may be grown until they merge above the fins. The epitaxial regions 345 provide a contact site to which a subsequent contact may be formed.

Additional processing steps (not shown) may be performed during the fabrication of the resistor device 300, such as silicidation processes on the epitaxial regions 345, the formation of contacts interfacing with the fins 305 and the gate structures 340. The insulating layer 320 may be recessed and a gate dielectric layer (not shown) may be formed beneath the gate structures 340, as shown above in reference to FIG. 2G. Subsequent metallization layers and interconnect lines and vias may also be formed.

Various structural characteristics of the resistor device 300 affect its resistance, such as the number of gate structures 340, the spacing between gate structures 340, etc. The gate structures 340 may not be evenly spaced, resulting in an asymmetric arrangement. The resistance of the resistor device 300 may be dynamically altered (i.e., during operation of an integrated circuit device including the resistor device 300) by applying a bias voltage to the gate structures 340 or by selectively programming one or more of the gate structures 340, as described above. In addition to affecting the resistance of the resistor device 300, the gate structures 340 also act as heat sinks to reduce the effects of localized heating during operation of the resistor device 300.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a plurality of fins;
   selectively removing a subset of the plurality of fins between at least a first fin and at least a second fin, leaving the at least a first fin to define a first fin portion and the at least a second fin to define a second fin portion;
   implanting a first type of dopant into a substrate to define a resistor body implanting said first type of dopant into said first and second fins, wherein said first fin portion is disposed above a first end of said resistor body and said second fin is disposed above a second end of said resistor body;
   forming an insulating layer above said resistor body; and
   forming at least one gate structure above said insulating layer and above said resistor body.

2. The method of claim 1, further comprising forming said insulating layer after selectively removing said subset of said plurality of fins.

3. The method of claim 1, further comprising applying a bias voltage to said at least one gate structure to affect a resistance of said resistor body.

4. The method of claim 1, further comprising:
   forming a second gate structure above said insulating layer and above said resistor body; and
   applying a programming voltage to said second gate structure sufficient to rupture said second gate structure.

5. The method of claim 1, further comprising:
   forming a plurality of gate structures above said insulating layer and above said resistor body, said plurality of gate structures including said at least one gate structure.

6. The method of claim 5, wherein said plurality of gate structures are asymmetrically spaced.

7. The method of claim 5, further comprising forming at least one dummy gate structure above said insulating layer, but not above said resistor body, adjacent one of said plurality of gate structures.

8. The method of claim 1, wherein said at least one gate structure is parallel to said first and second fins.

9. The method of claim 1, further comprising:
   planarizing said insulating layer to expose top surfaces of said first and second fins; and
   forming epitaxial regions on said top surfaces.

10. A method, comprising:
    forming a plurality of fins;
    selectively removing one or more of said plurality of fins between a first subset of fins and a second subset of fins, leaving the first subset of fins and the second subset of fins;
    implanting a first type of dopant into a substrate between said first and second subsets of said fins to define a resistor body;
    implanting said first type dopant into said first and second subsets of said fins, wherein said first subset is disposed above a first end of said resistor body and said second subset is disposed above a second end of said resistor body;
    forming an insulating layer above said resistor body; and
    forming at least one gate structure parallel to said first and second subsets of said fins above said insulating layer and above said resistor body.

11. The method of claim 10, further comprising forming said insulating layer after selectively removing said one or more of said plurality of fins.

12. The method of claim 10, further comprising applying a bias voltage to said at least one gate structure to affect a resistance of said resistor body.

13. The method of claim 10, further comprising:
    forming a second gate structure above said insulating layer and above said resistor body; and
    applying a programming voltage to said second gate structure sufficient to rupture said second gate structure.

14. The method of claim 10, further comprising:
forming a plurality of gate structures above said insulating layer and above said resistor body, said plurality of gate structures including said at least one gate structure.

15. The method of claim 14, wherein said plurality of gate structures are asymmetrically spaced.

16. The method of claim 14, further comprising forming at least one dummy gate structure above said insulating layer, but not above said resistor body, adjacent one of said plurality of gate structures.

17. The method of claim 10, further comprising:
planarizing said insulating layer to expose top surfaces of said first and second subsets of said fins; and
forming epitaxial regions on said top surfaces.

* * * * *